United States Patent [19]
Morris et al.

[11] Patent Number: 5,371,570
[45] Date of Patent: Dec. 6, 1994

[54] REFRACTIVE/DIFFRACTIVE OPTICAL SYSTEM FOR BROAD-BAND THROUGH-THE-LENS IMAGING OF ALIGNMENT MARKS ON SUBSTRATES IN STEPPER MACHINES

[75] Inventors: G. Michael Morris, Fairport, N.Y.; Yasuhiro Yoshitake, Yokohama, Japan

[73] Assignee: The University of Rochester, Rochester, N.Y.

[21] Appl. No.: 157
[22] Filed: Jan. 4, 1993
[51] Int. Cl.⁵ .............................. G03B 27/42
[52] U.S. Cl. ........................ 355/53; 355/41; 355/68; 355/71
[58] Field of Search ............ 355/41, 53, 68, 71

[56] References Cited

U.S. PATENT DOCUMENTS

| | | | |
|---|---|---|---|
| 4,770,477 | 9/1988 | Shafer | 350/1.2 |
| 4,798,962 | 1/1989 | Matsumoto et al. | 250/548 |
| 4,962,318 | 10/1990 | Nishi | 250/548 |
| 5,094,539 | 3/1992 | Komoriya et al. | 356/401 |
| 5,140,366 | 8/1992 | Shiozawa et al. | 355/53 |

OTHER PUBLICATIONS

Broadband Imaging with Holographic Lenses–Optical Engineering Jun. 1989 vol. 28 No. 6 pp. 592–598.

Primary Examiner—Michael L. Gellner
Assistant Examiner—Daniel P. Malley
Attorney, Agent, or Firm—M. Lukacher

[57] ABSTRACT

A chromatic aberration-corrected optical system for broad-band through-the-lens (TTL) imaging and position detection of alignment marks deposed on a substrate located at the exposure plane of an exposure apparatus, for example, a stepper machine, uses a first projection lens capable of focusing a first broad-band alignment illumination and a second exposure illumination onto the substrate. A second achromat lens and a third refractive/diffractive hybrid lens are configured and designed to provide, in conjunction with the first projection lens, longitudinal and lateral chromatic aberration correction over a wavelength range from about 550–650 nm of the broad-band alignment illumination.

11 Claims, 6 Drawing Sheets

REFRACTIVE/DIFFRACTIVE OPTICAL SYSTEM FOR BROAD-BAND THROUGH-THE-LENS IMAGING OF ALIGNMENT MARKS ON SUBSTRATES IN STEPPER MACHINES

FIELD AND SUMMARY OF THE INVENTION

The present invention relates generally to optical imaging systems for broad-band imaging through a lens which is subject to chromatic aberration. The invention is especially useful in exposure systems and particularly in such systems as used in optical stepper machines having an alignment detection system. The imaging system uses a first projection lens, a second achromatic lens and a third refractive/diffractive hybrid lens such that broad-band illumination through the projection lens may be used to detect alignment marks on a substrate with correction for chromatic aberrations in the projection lens.

BACKGROUND OF THE INVENTION

An exposure apparatus known as a stepper is a main production machine for semiconductor fabrication. A stepper is used to image circuit patterns recorded on a mask and print them through a projection lens on a wafer using a step and repeat procedure. Generally, the circuit patterns are stratified into many layers. To retain LSI (Large Scale Integrated) circuit performance, a given layer must be accurately aligned to a previously patterned layer on the wafer. Alignment is frequently accomplished by detecting alignment marks on the wafer. Prior to exposure, the wafer is usually coated with a photoresist-type material using a spin-coating method. In the coating process, the photoresist spreads radially, and often forms an asymmetrical shape around the alignment marks, particularly when such marks are raised or recessed with respect to surrounding, relatively planar areas on the wafer or substrate. The intensity of light reflected from the photoresist is sensitive to the thickness of the photoresist. Therefore, images of the asymmetrically covered alignment marks can be deformed asymmetrically; this produces degradation in the alignment accuracy. However, it is well known that broad-band illumination can reduce this problem. Using broad-band illumination, the intensity of the reflected light is less sensitive to fluctuation of the photoresist thickness, and symmetrical images can be expected in spite of asymmetrical photoresist coverage.

A broad-band light alignment system, which is separated from the projection lens, i.e., a non-TTL (Through-The-Lens) system is described by Nishi in U.S. Pat. No. 4,962,318, issued Oct. 9, 1990. However, there are difficulties with Nishi's system. In practice, the projection lens is mounted using structures of steel, and the lens can move slightly due to environmental factors, such as temperature variations or vibration. A non-TTL system cannot respond to such movement of the projection lens, hence, there are alignment errors. In contrast, a through-the-lens (TTL) alignment system incorporates environmentally induced movements of the projection lens assembly of the stepper automatically, a feature which is essential for accurate alignment. There is, however, a different problem with a TTL alignment system using broad-band light. Normally, the projection lens is designed to have the best performance at a single exposure wavelength (typically, an ultraviolet wavelength). The wavelength of the light used for alignment should be selected at a different wavelength from the exposure light so as not to expose the photoresist. Therefore, TTL systems using broad-band alignment light have difficulty generating high quality images due to the longitudinal and latitudinal or lateral chromatic aberration introduced by the projection lens. To overcome this problem, a chromatic aberration correction system was described by Komoriya et. al. in U.S. Pat. No. 5,094,539, issued Mar. 10, 1992. The Komoriya et. al. correction system consists of more than ten refractive lens elements, which is complicated and expensive to fabricate and to maintain. Yoshitake et. al. describe in JP4-019800, filed in Japan on Feb. 5, 1992, a reduction projection exposure system comprising a reduction projection lens optimized at one wavelength, an illumination apparatus illuminating alignment marks on a substrate through the reduction projection lens with broad-band light, and an alignment mark detection apparatus having an optically diffractive holographic element intended for correcting chromatic aberrations caused in the reduction projection lens during the alignment mark detection. However, the Yoshitake et. al. disclosure fails to provide any lateral chromatic aberration correction, and provides only marginal longitudinal chromatic aberration correction with the holographic diffractive optical element in the alignment apparatus. Furthermore, diffractive elements of the holographic type are generally less effective transmitters of light than diffractive elements of the kinoform type or of the blazed-grating type. Highest possible light transmission is important in an alignment mark detection system.

To counteract the spectral or wavelength dispersion introduced by the projection lens, Komoriya et. al. had to employ many refractive lens elements. The projection lens itself usually consists of more than 10 glass elements, and each glass element introduces dispersion, which causes chromatic aberration. Therefore, using a conventional approach, to correct these aberrations, one essentially needs to use a comparable number of refractive lenses in the alignment system, as disclosed in Komoriya et. al. To reduce the number of elements, at least one element in the correction system must provide a large and negative dispersion value. Glass elements cannot satisfy this requirement. However, a diffractive lens has precisely these characteristics. The dispersion (or Abbe V-number) of a solely diffractive lens element can be $-3.45$, while that of any refractive glass lens element ranges between 20 and 80. The V-number of a diffractive lens is approximately seven times more dispersive than any known glass and exhibits a negative dispersion, i.e., with a diffractive lens a red ray of light bends more than a blue ray, whereas with a refractive glass lens blue bends more than red. The operation of a diffractive lens relies on interference and diffraction, rather than on refraction of light as in a glass lens. Diffractive lenses include holographic optical elements, blazed gratings and kinoforms. By utilizing a diffractive lens, it is possible to significantly reduce the number of elements necessary for the correction system. This reduction of the number of elements has been disclosed by Yoshitake et. al. in the aforementioned JP4-019800 patent application, although with inadequate correction for chromatic aberrations.

OBJECTS AND ADVANTAGES OF THE INVENTION

In accordance with the present invention, there is provided a refractive/diffractive hybrid optical alignment system for a broad-band through-the-lens (TTL) optical imaging system, especially for imaging alignment marks on a substrate in stepper machines.

It is a principal object of the present invention to provide a TTL alignment system which corrects for both longitudinal and lateral chromatic aberrations originating in the reduction projection lens of a stepper machine.

A further object of the invention is to provide a TTL alignment system with a refractive/diffractive hybrid lens for chromatic aberration correction throughout a wavelength range.

A still further object of the invention is to provide a TTL alignment system which corrects for chromatic aberrations in a reduction projection lens throughout a wavelength range of between about 550 nm and about 650 nm of the broad-band alignment illumination.

Another object of the invention is to provide a TTL alignment system with chromatic aberrations correction having a reduced number of refractive lens elements.

Still another object of the invention is to provide a broad-band TTL optical alignment system in which only two achromatic refractive lenses are used in addition to the refractive/diffractive hybrid lens.

Chromatic aberrations, in longitudinal as well as latitudinal (or lateral) directions, occur in refractive optical lens systems (for example, in reduction projection lens assemblies of stepper machines) whenever such lens systems are operated at illumination wavelengths different from a single wavelength for which the projection lens has been optimized. Chromatic aberrations are a consequence of the spectrally dispersive nature of optical elements. For example, a stepper reduction projection lens optimized for operation at a single wavelength of about 436 nm (the so-called g-line of a mercury lamp light source), or optimized for operation at about 405 nm (h-line), or at about 365 nm (i-line), or even in the far ultraviolet region at about 250 nm (an emission wavelength of an excimer laser source), will have chromatic aberrations when operated at other, non-optimized wavelengths. Chromatic aberrations are particularly pronounced, when a relatively broad spectral range (for example, a range from 550 nm to 650 nm) of illumination is to be passed through a projection lens optimized at, for example, 405.5 nm (h-line of a mercury lamp light source), especially since the broad-band illumination has to pass through-the-lens (TTL) twice,-namely once through the lens as illuminating light for alignment marks in the direction toward the substrate having alignment marks, and once as reflected light back through the lens in the direction of the alignment mark detection system. Such pronounced chromatic aberrations can seriously distort and/or blur the appearance of alignment marks, and can therefore, adversely affect the positional accuracy of alignment between marks on the wafer substrate and marks on a mask projected onto said substrate through the reduction projection lens of a stepper machine.

Correction for chromatic aberrations, in accordance with the present invention, is accomplished by an alignment system having a hybrid (or compound) refractive/diffractive lens and an aperture stop associated with that hybrid lens.

One advantage of the present invention is that the spectrally broad-band alignment system corrects for both longitudinal and lateral chromatic aberrations in a projection lens during the alignment procedure.

Another advantage of this invention is that the broad-band alignment system uses fewer refractive lens elements than prior art systems.

A further advantage of the invention is that the spectrally broad-band alignment system is a TTL alignment system.

A still further advantage of the invention is that the spectrally broad-band alignment illumination is selected in a spectral wavelength range where a photoresist coating, on a wafer or substrate having alignment marks to be imaged, is not reactive to that alignment illumination.

An additional advantage of the present invention is that the chromatic aberration correction by the refractive/diffractive hybrid lens can be used for TTL alignment in stepper machines having a projection lens optimized for imaging exposure at any one particular wavelength.

BRIEF DESCRIPTION OF THE DRAWINGS

The foregoing and other objects, features and advantages of the invention will become more readily apparent by reference to the following detailed description when considered in conjunction with the accompanying drawings, wherein.

DETAILED DESCRIPTION

Figure 1:
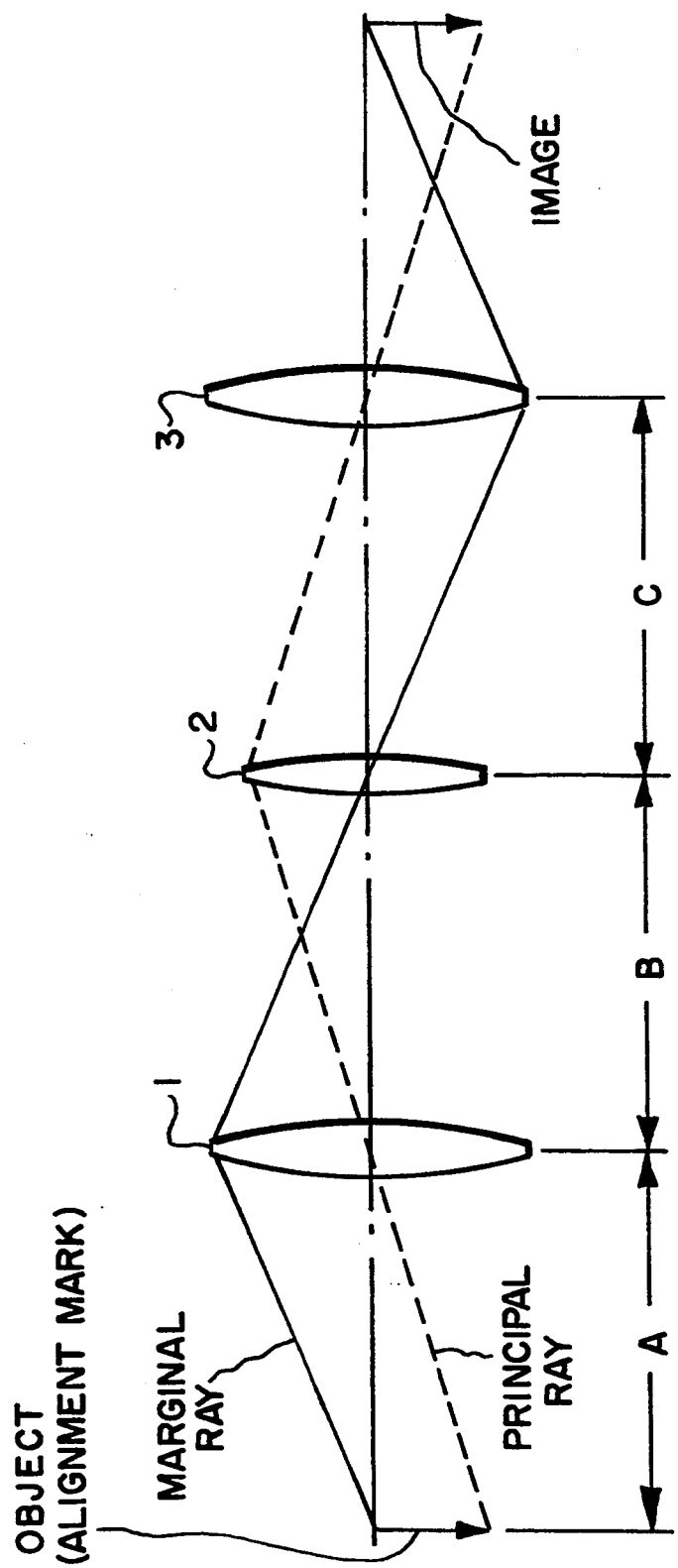
Fig. 1 is a schematic representation of a 3-lens model system used to define the condition required for an achromatic optical system.

In FIG. 1, a so-called Shupmann 3-lens optical system is shown as a model system to define the condition required for an achromatic optical system, i.e., for an optical system free of chromatic aberrations throughout a desired wavelength range of an illuminating system. The Shupmann optical system has been analyzed by Faklis and Morris, as reported in the publication Opt. Engin., No. 6, Vol. 28, 1989, pp. 592–598.

Lens 2 is located at the image point of lens 1 and also images lens 1 onto lens 3. Lens 3 relays the image formed by Lens 1. A condition required for an achromatic system is given by the following equation:

$$\phi_3(\lambda) = -\frac{B^2}{C^2}\{\phi_1(\lambda) - \phi_1(\lambda_0)\} + \phi_3(\lambda_0), \quad (1)$$

where $\lambda$ is an operating wavelength, $\lambda_0$ is the design (or center) wavelength in a range of the operating wavelength, $\phi_1$ is the optical power of lens 1, $\phi_3$ is the optical power of lens 3, B is the distance between lens 1 and lens 2, and C is the distance between lens 2 and lens 3.

Figure 2:
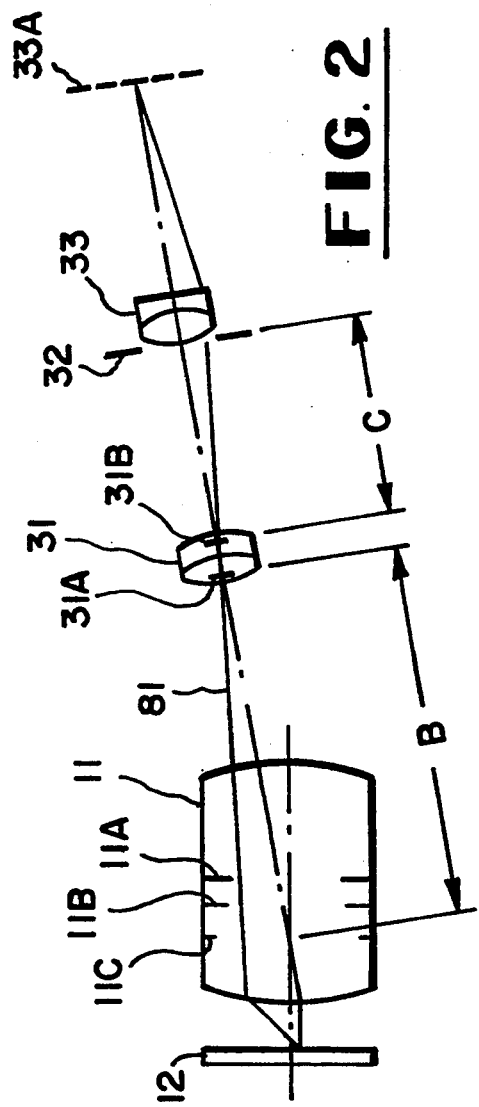
FIG. 2 shows a practical configuration of an achromatic optical system using the hybrid (or compound) refractive/diffractive lens in accordance with the present invention.

FIG. 2 shows a practical Configuration of an achromatic optical system using the hybrid (or compound) refractive/diffractive lens in accordance with the invention. Lenses 1, 2 and 3 in FIG. 1 have been replaced by projection lens 11, the achromat lens 31 and refractive/diffractive hybrid lens 33, respectively. A paraxial ray 81 of the center wavelength $\lambda_0$ emitted from an alignment mark on the wafer 12 converges on the front principal point 31A of the achromat lens 31 through the projection lens 11, and then, emitted from the rear principal point 31B, the paraxial ray 81 converges on the secondary image plane 33A through the refractive/diffractive hybrid lens 33. As an example for the projection lens 11, an h-line (405.5 nm) projection lens which is disclosed by Shafer in U.S. Pat. No. 4,770,477, is taken. The data of the curvatures, thickness, and the glass materials in the projection lens are listed in Table 1.

TABLE 1

Mercury h-line (405.5 nm) Design
5 × Magnification
0.35 numerical aperture
24 mm field diameter
Unit: mm

| Surface | Curvature | Thickness | Glass |
| --- | --- | --- | --- |
| Object | 0.00000000 | 12.836980 | Air |
| S1 | 0.00920404 | 3.810000 | Schott LF5 |
| S2 | 0.01812579 | 30.649824 | Air |
| S3 | −0.02523014 | 6.350000 | Fused Silica |
| S4 | −0.01903636 | 12.037365 | Air |
| S5 | −0.00902611 | 13.390880 | Fused Silica |
| S6 | −0.01236653 | 4.795520 | Air |
| S7 | 0.00285564 | 31.750000 | Fused Silica |
| S8 | −0.01021591 | 2.540000 | Air |
| S9 | 0.00531074 | 35.560000 | Fused Silica |
| S10 | −0.00915616 | 1.893291 | Air |
| S11 | −0.00964527 | 8.321446 | Schott LF5 |
| S12 | 0.00775857 | 1.783080 | Air |
| S13 | 0.00762794 | 40.640000 | Fused Silica |
| S14 | −0.00574017 | 2.540000 | Air |
| S15 | 0.00872893 | 31.750000 | Fused Silica |
| S16 | −0.00162331 | 2.540000 | Air |
| S17 | 0.01518926 | 7.620000 | Fused Silica |
| S18 | 0.01815358 | 48.874223 | Air |

TABLE 1-continued

Mercury h-line (405.5 nm) Design
5 × Magnification
0.35 numerical aperture
24 mm field diameter
Unit: mm

| Surface | Curvature | Thickness | Glass |
| --- | --- | --- | --- |
| S19 | −0.01119420 | 7.620000 | Schott LF5 |
| S20 | 0.00558275 | 3.540000 | Air |
| Stop | 0.00000000 | 15.151860 | Air |
| S22 | −0.02072136 | 21.414740 | Fused Silica |
| S23 | −0.01501763 | 3.169920 | Air |
| S24 | −0.00302574 | 17.780000 | Fused Silica |
| S25 | −0.00817112 | 2.540000 | Air |
| S26 | 0.00079734 | 15.240000 | Fused Silica |
| S27 | −0.00336819 | 0.000000 | |
| S28 | 0.00331052 | 15.240000 | Fused Silica |
| S29 | 0.00042021 | 606.103632 | Air |
| Image | 0.00000000 | 0.000000 | |

To improve the performance at the h-line (exposure) wavelength, the data given by Shafer had to be modified slightly.

Figure 3:
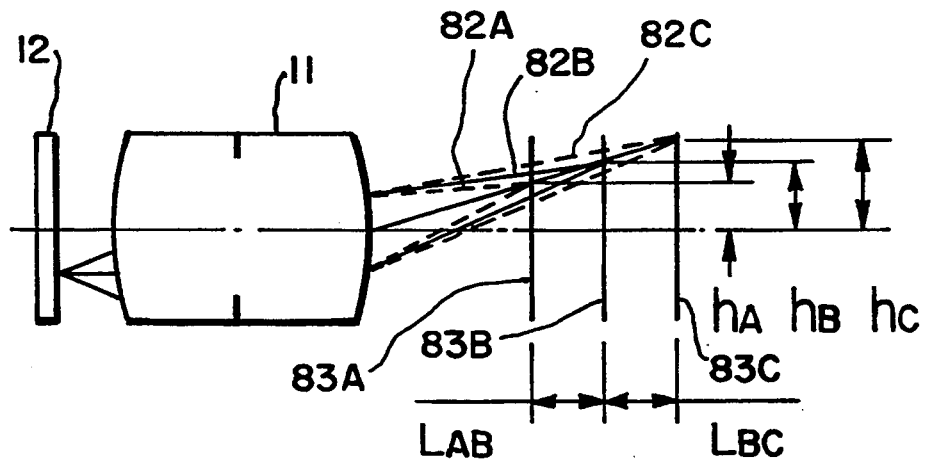
FIG. 3 indicates schematically the spread of image points due to chromatic aberration in an h-line stepper projection lens, caused by broad-band through-the-lens (TTL) illumination from the alignment system.

In the design for the alignment system, the illumination wavelengths were set to range from 550 nm to 650 nm. We have found that this range is large enough to eliminate the sensitivity of the alignment accuracy due to the fluctuation of photoresist thickness [also see Nishi, U.S. Pat. No. 4,962,318, col. 3, lines 18–27]. Alignment marks are usually located at the edge of the field so that the optical path of the alignment system does not interfere with the exposure light. For an exemplary alignment system, the object height is selected to be 10 mm, and it follows that the system is an off-axis optical system. In this system each wavelength produces a different image point. FIG. 3 shows the spread of the image points of the h-line projection lens. The numerals, 82A, 82B and 82C indicate the paraxial rays at 550 nm, 600 nm and 650 nm, respectively. The numerals 83A, 83B and 83C show the image planes, and the symbols $h_A$, $h_B$ and $h_C$ indicate the image height for the wavelengths 550 nm, 600 nm and 650 nm, respectively. The image plane distances $L_{AB}$, and $L_{BC}$, are 5.65 mm and 5.63 mm, respectively. The image magnification difference $\Delta M$ is defined as follows:

$$\Delta M = \frac{h_C - h_A}{h_B} \times 100. \quad (2)$$

$\Delta M$ is 1.18% for the projection lens listed in Table 1.

Figure 4:
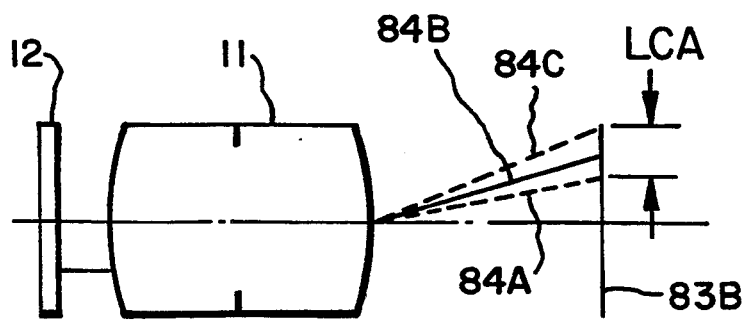
FIG. 4 shows the spectrally dependent (chromatic) change in image height of the principal ray (LCA)

Using thin-lens theory, the chromatic change in image height of the principal ray of lens 1 in Fig. 1 is essentially zero. However, the chromatic change in image height of the principal ray of an actual projection lens is not zero. FIG. 4 shows the chromatic change in image height of the principal ray, LCA. The numeral 84A, 84B and 84C indicate the principal rays of wavelength 550 nm, 600 nm and 650 nm, respectively. LCA denotes the height difference between the rays at wavelengths 550 nm and 650 nm at the image plane, relative to the center wavelength $\lambda_O = 600$ nm. LCA should be urged to be zero to complete an achromatic Shupmann system. Using the publication, *Aberrations of Optical Systems*, W. T. Welford, Adam Hilger, 1989, p. 207, it is found that LCA can be described by the following equation:

$$LCA = -\frac{1}{\mu_k'} \sum_S n_S \beta_S Y_S \Delta n_S, \quad (3)$$

-continued in which, $$\Delta n_S = \left( \frac{dn_S}{n_S} - \frac{dn_{S-1}}{n_{S-1}} \right)$$

$$dn_S = n_S(\lambda_2) - n_S(\lambda_1)$$

$$n_S = n_S(\lambda_0)$$

where $u'_k$ is the convergence angle of the marginal ray in the image space, $n_S$ and $\beta_S$ are the refractive index and the angle of refraction of the principal ray in the medium after surface S, and $Y_S$ is the height of the marginal ray.

Figure 5:
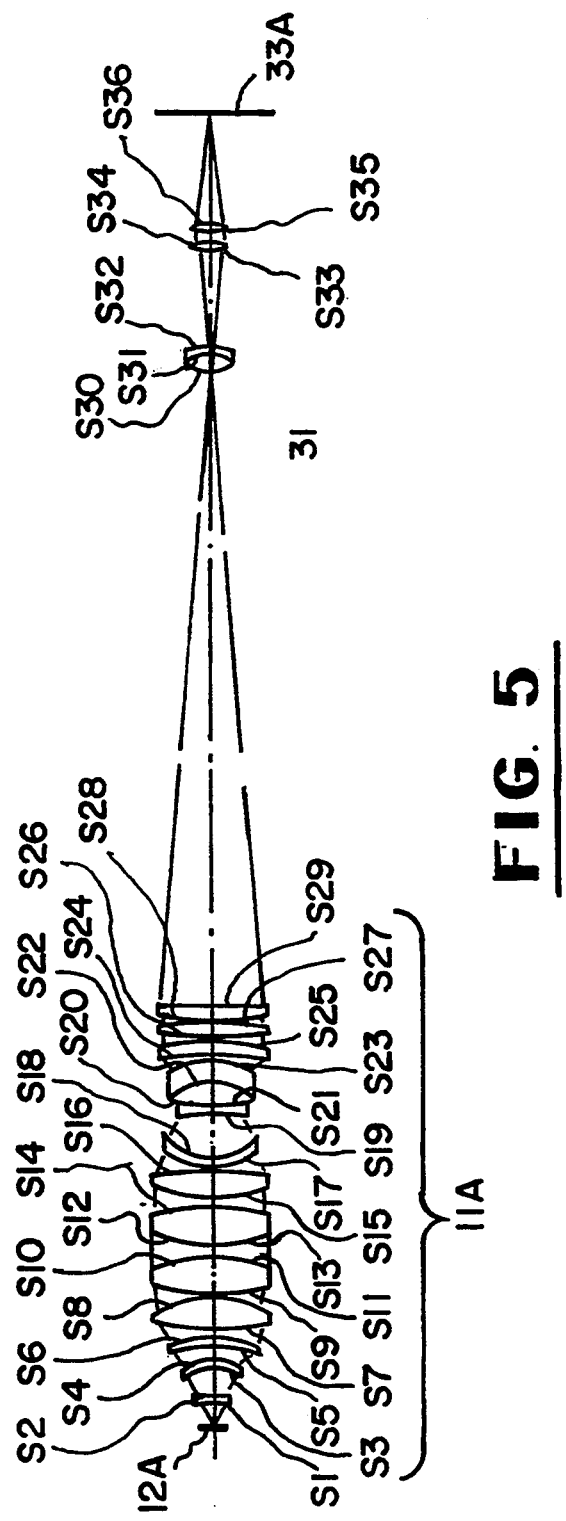
FIG. 5 is a schematic layout of an h-line (405.5 nm) projection lens assembly and of the two alignment system lenses, in accordance with the invention, and showing the lens surfaces and their relative positions as well as the object and image planes.
Figure 6:
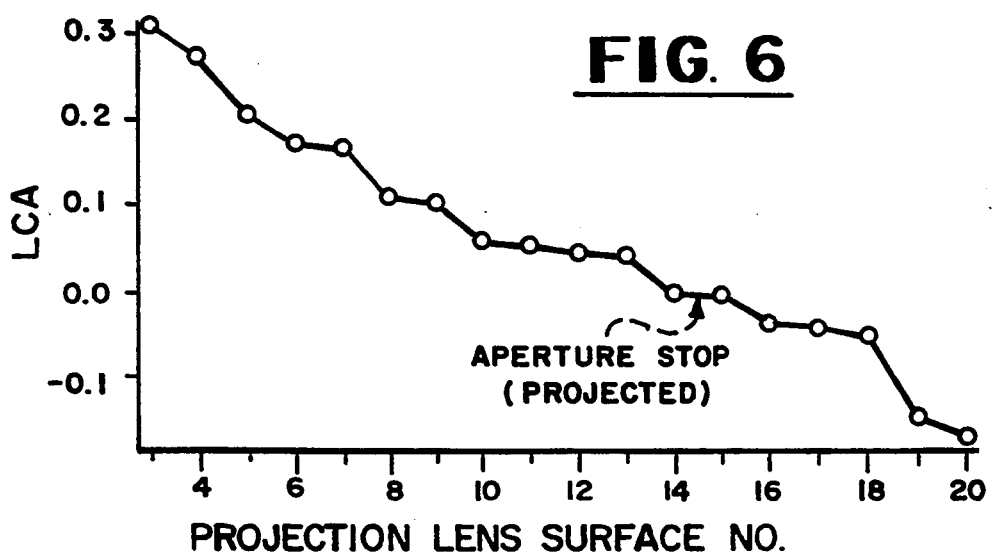
FIG. 6 depicts the relationship between the location of an aperture stop with respect to the surfaces of the lens elements of the projection lens of FIG. 5, and image height of the principal ray (LCA) of the projection lens assembly of FIG. 5.

FIG. 5 shows a layout of the h-line projection lens. LCA can be made to be zero by changing the location of the aperture stop. FIG. 6 shows the relation between the aperture stop location and LCA. It should be noted that LCA is zero around surface 15. When the stop is set 1.9 mm behind surface 14, LCA becomes exactly zero. In a practical system, it is impossible to set the stop at such a location because it will degrade the performance of the projection lens. Instead, the same effect can be obtained (see FIG. 2) by setting the stop 32 in contact with the refractive/diffractive lens 33. In FIG. 2, the numeral 11A indicates an actual stop of the projection lens 11. The numeral 11B shows the location of the stop that makes LCA to be zero, and the numeral 11C shows the image of the stop 11B that is seen from the image side. The distance B in Eq. (1) is defined as the distance between the location of the stop image 11C and the front principal point 31A of the achromat lens 31. The distance C is defined as the distance between the rear principal point 31B and the stop 32 of the refractive/diffractive hybrid lens 33. The principal point 31A of the achromat lens 31 is located at the image point of the projection lens 11 at the center wavelength ($\lambda_O$=600 nm).

Once a focal length of the achromat lens 31 is determined, a distance C is obtained using the following equation:

$$1/F_2 = 1B + 1C, \qquad (4)$$

Where $F_2$ is a focal length of the achromat lens 31, and is set to $F_2$=100 mm. The distance B is taken to be 951.89 mm. Substituting these parameters into Eq. (4), the distance C is found to be C=111.74 mm.

Figure 7:
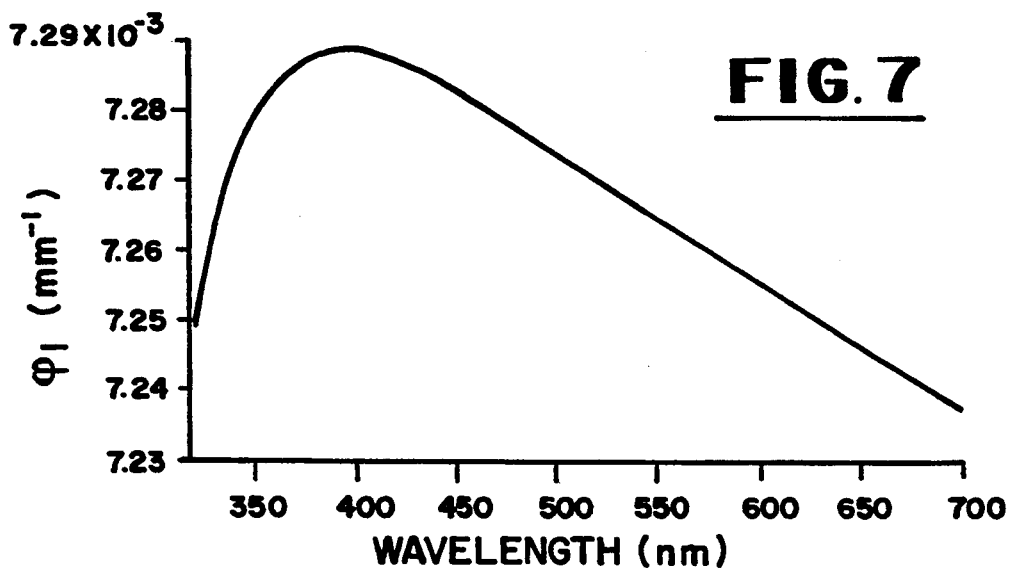
FIG. 7 indicates the wavelength dependence of the optical power of the projection lens assembly of FIG. 5.
Figure 8:
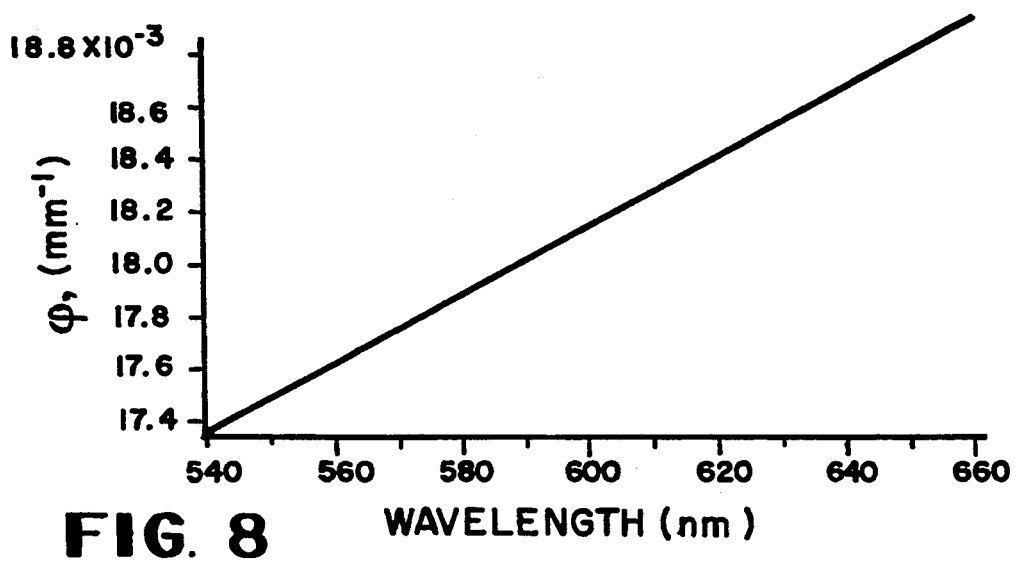
FIG. 8 is a graph showing the calculated required optical power of the third lens of the 3-lens model system of FIG. 1.

To achieve an achromatic system, it is required that Eq. (1) be satisfied. The wavelength dependence of the optical power of the projection lens, $\phi_1(\lambda)$ is shown in FIG. 7. The h-line projection lens is designed to be least sensitive to the wavelength variations around the h-line ($\lambda$=405.5 nm). The range of the light (550 nm to 650 nm) used for the alignment system is far enough from the h-line to produce an approximately linear dependence of lens power $\phi_1(\lambda)$ versus wavelength,$\lambda$. In Eq. (1), $_{100}3(\lambda)$ is set to 1/55 mm$^{-1}$ so that the total magnification of the system will be approximately 5/1. Substituting the above parameters into Eq. (1), the required optical power for lens 3 (in FIG. 1), $_{100}3(\lambda)$, is obtained. FIG. 8 shows a plot of this required lens power, $_{100}3(\lambda)$. Note that $_{100}3(\lambda)$, is also approximately linear due to the linearity of $\phi_1(\lambda)$ in the wavelength range between 550 nm and 650 nm. The following solution is based on this linearity of optical powers with wavelength. This solution is also applicable to projection lenses designed for operation with an i-line ($\lambda$=365 nm) exposure wavelength or the excimer laser (e.g., KrF laser, $\lambda$=248 nm) illumination because these lenses are also optimized at the exposure wavelength and their relations between the power and the wavelength are also linear in the range of visible light used for the alignment system.

To obtain the best fit to the theoretical curve shown in FIG. 8, the alignment system of the present invention uses a refractive/diffractive hybrid lens 33. The refractive/diffractive hybrid lens 33 in FIGS. 2 and 11 consists of a diffractive lens. Using thin-lens theory, the total power of the refractive/diffractive hybrid lens 33 is given by $$\phi_3(\lambda)\phi_{rA}(\lambda) + \phi_{rB}(\lambda) + \phi_d(\lambda), \qquad (5)$$

where $\phi_{rA}$ is the power of the first part of the refractive doublet, $\phi_{rB}$ is the power of the second part of the refractive doublet, and $\phi_d$ is the power of the diffractive lens. The first derivative of Eq. (5) is given by $$\Delta\phi_3 = -\left( \frac{\phi_{rA}(\lambda_0)}{V_{rA}} + \frac{\phi_{rB}(\lambda_0)}{V_{rB}} \right) + \phi_d(\lambda_0)\frac{\Delta\lambda}{\lambda_0}, \qquad (6)$$

in which $$V_{rA} = \frac{n_{rA}(\lambda_0) - 1}{n_{rA}(\lambda_2) - n_{rA}(\lambda_1)}$$

$$V_{rB} = \frac{n_{rB}(\lambda_0) - 1}{n_{rB}(\lambda_2) - n_{rB}(\lambda_1)}.$$

where $\lambda_0$, $\lambda_1$ and $\lambda_2$ are 600 nm, 550 nm and 650 nm, respectively, and $\Delta\lambda$ is 100 nm. To obtain the best fit to the theoretical curve shown in FIG. 8, the following condition is required:

$$\frac{\phi_{rA}(\lambda_0)}{V_{rA}} + \frac{\phi_{rB}(\lambda_0)}{V_{rB}} = 0. \qquad (7)$$

This is the condition required if the refractive doublet is to be an achromat. Using Eqs. (6) and (7), the required optical power of the diffractive lens is found to be:

$$\phi_d(\lambda_0) = \frac{\lambda_0}{\Delta\lambda} \Delta\phi_3. \qquad (8)$$

The total optical power of the doublet is $$\phi_{rA}(\lambda_0) + \phi_{rB}(\lambda_0) = \phi_3(\lambda_0) - \phi_d(\lambda_0) \qquad (9)$$

The required optical powers for each component of the doublet are obtained using Eqs. (7) and (9) as follows:

$$\phi_{rA} = \frac{V_{rA}}{V_{rA} - V_{rB}} \{\phi_3(\lambda_0) - \phi_d(\lambda_0)\} \qquad (10)$$

$$\phi_{rB} = \frac{V_{rB}}{V_{rB} - V_{rA}} \{\phi_3(\lambda_0) - \phi_d(\lambda_0)\}. \qquad (11)$$

On the other hand, these optical powers can be described in terms of surface curvatures:

$$\phi_{rA}(\lambda_0) = (n_{rA}(\lambda_0) - 1)(c_2 - c_1) \qquad (12)$$

$$\phi_{rB}(\lambda_0) = (n_{rB}(\lambda_0) - 1)(c_3 - c_2), \qquad (13)$$

where $c_1$ and $c_2$ are the curvatures of the front and the rear surface of the first part of the doublet, and $c_3$ is a curvature of the rear surface of the second part of the doublet. To make it easy to form a diffractive lens on the doublet, curvature $c_3$ is set to zero (i.e., required to be a flat surface). Once $\phi_d(\lambda)$ is calculated using Eq. (8), $c_2$ is obtained with Eqs. (11) and (13), and c1 is calculated using Eqs. (10) and (12). For this design example, we choose the following glass types for the doublet- Schott BK7 and F2, which are inexpensive glass types commonly used in industry. Using the design procedure described above, the first-order design parameters for the refractive/diffractive hybrid lens 33 are obtained as follows: $\phi_d(\lambda_0) = 0.0075$ mm$^{-1}$, $c_1 = 0.0255$ mm$^{-1}$, $c_1 = 0.0255$ mm$^{-1}$, $c_2 = -0.0241$ mm$^{-1}$ and $c_3 = 0.0$ mm$^{-1}$.

These parameters and the distance C are optimized utilizing commercial lens design software. Table 2 shows the lens data obtained after the optimization.

TABLE 2

Broad-band (550 nm-650 nm) Alignment System Design
5 × Magnification
0.175 numerical aperture
Object height; 10 mm
Unit: mm

| Surface | Curvature | Thickness | Glass |
|---|---|---|---|
| Object | 0.00000000 | 12.836980 | Air |
| S1 | 0.00920404 | 3.810000 | Schott LF5 |
| S2 | 0.01812579 | 30.649824 | Air |
| S3 | −0.02523014 | 6.350000 | Fused Silica |
| S4 | −0.01903636 | 12.037365 | Air |
| S5 | −0.00902611 | 13.390880 | Fused Silica |
| S6 | −0.01236653 | 4.795520 | Air |
| S7 | 0.00285564 | 31.750000 | Fused Silica |
| S8 | −0.01021591 | 2.540000 | Air |
| S9 | 0.00531074 | 35.560000 | Fused Silica |
| S10 | −0.00915616 | 1.893291 | Air |
| S11 | −0.00964527 | 8.321446 | Schott LF5 |
| S12 | 0.00775857 | 1.783080 | Air |
| S13 | 0.00762794 | 40.640000 | Fused Silica |
| S14 | −0.00574017 | 2.540000 | Air |
| S15 | 0.00872893 | 31.750000 | Fused Silica |
| S16 | −0.00162331 | 2.540000 | Air |
| S17 | 0.01518926 | 7.620000 | Fused Silica |
| S18 | 0.01815358 | 48.874223 | Air |
| S19 | −0.01119420 | 7.620000 | Schott LF5 |
| S20 | 0.00558275 | 3.540000 | Air |
| S21 | 0.00000000 | 15.151860 | Air |
| S22 | −0.02072136 | 21.414740 | Fused Silica |
| S23 | −0.01501763 | 3.169920 | Air |
| S24 | −0.00302574 | 17.780000 | Fused Silica |
| S25 | −0.00817112 | 2.540000 | Air |
| S26 | 0.00079734 | 15.240000 | Fused Silica |
| S27 | −0.00336819 | 0.000000 | |
| S28 | 0.00331052 | 15.240000 | Fused Silica |
| S29 | 0.00042021 | 622.440000 | Air |
| S30 | 0.01555694 | 6.230000 | Schott SK11 |
| S31 | −0.02223210 | 2.500000 | Schott SF5 |
| S32 | −0.00554232 | 100.473524 | Air |
| Stop | 0.03318571 | 5.300000 | Schott SK7 |
| S34 | −0.04330520 | 4.000000 | Schott F2 |
| S35 | 0.00000000 | 0.000100 | Virtual |
| S36 | −0.00000063 | 103.095781 | Air |
| Image | 0.00000000 | 0.000000 | |

For the optimization with commercial lens-design programs, it is convenient to describe the diffractive lens in the same manner as a refractive lens. Sweatt proposed a convenient method to describe a diffractive lens for use with lens-design software in his paper, "Describing holographic optical elements as lenses", J. Opt. Soc. Am., Vol. 67, No. 6, 1977, pp. 803-808. With this method, the optical power of a diffractive lens, $\phi_d(\lambda)$ can be described as a thin lens that possesses a very large index of refraction, i.e., $$\phi_d(\lambda) = (n(\lambda) - 1)(c_A - c_B) \tag{14}$$

in which, $$n(\lambda) = \frac{\lambda}{\lambda_0} N + 1, \tag{15}$$

where $c_A$ and $c_B$ are the curvatures of a diffractive lens, and $n(\lambda)$ is an effective refractive index of the diffractive lens. To accurately model the behavior of a diffractive lens, N should be a very large number. In practice, N is typically set to N=10,000. Using this method, a diffractive lens can be described just like a refractive lens as shown in Table 2. The curvature, $c_A$ which corresponds to the curvature of S35 is set to zero for ease of fabrication.

Figure 9:
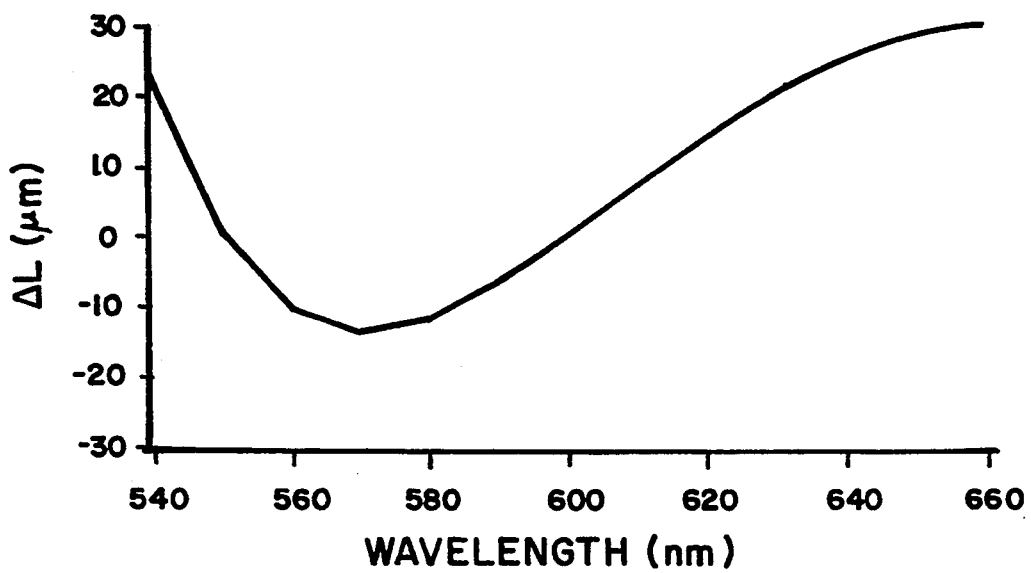
FIG. 9 shows a plot of the difference in image plane location $\Delta L$ at different wavelengths, relative to the image plane location at the center wavelength ($\lambda_O=600$ nm) versus wavelength.
Figure 10:
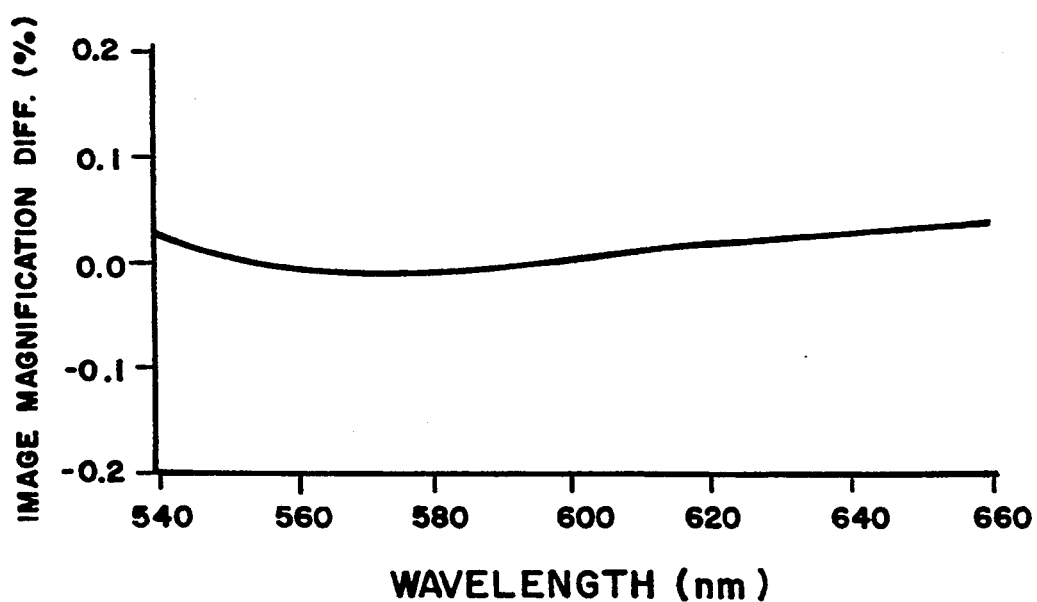
FIG. 10 indicates the difference in image magnification in percent at different wavelengths, relative to the magnification at the center wavelength ($\lambda_O=600$ nm) versus wavelength.

FIG. 9 shows a plot of the difference in image plane location ΔL relative to the location of the image plane using the center wavelength ($\lambda_0 = 600$ nm) versus wavelength, and FIG. 10 shows the relationship of the image magnification difference at different wavelengths, respectively. Note that in the region from 550 nm to 650 nm, the spread of ΔL and image magnification differences are less than 50 μm, and less than 0.05%, respectively. Originally, without the correction system, these numbers were 11.28 nm and 1.18%, respectively.

Once $\phi_d(\lambda_0)$ is obtained, a blaze profile of a diffractive lens surface, d(r) can be calculated as follows:

$$d(r_m) = d_{max}\left(m - \frac{\phi_d(\lambda_0)}{2\lambda_0} r_m^2\right), \tag{16}$$

in which $$d_{max} = \frac{\lambda_0}{n_{dif} - 1}$$

and $$\sqrt{\frac{2(m-1)\lambda_0}{\phi_d(\lambda_0)}} \leq r_m < \sqrt{\frac{2m\lambda_0}{\phi_d(\lambda_0)}}, \tag{17}$$

where m is an integer $>0$, and $n_{dif}$ is a refractive index of an actual material of the diffractive lens. The blaze profile can also be approximated by a linear profile or step or saw-tooth like structures.

Figure 11:
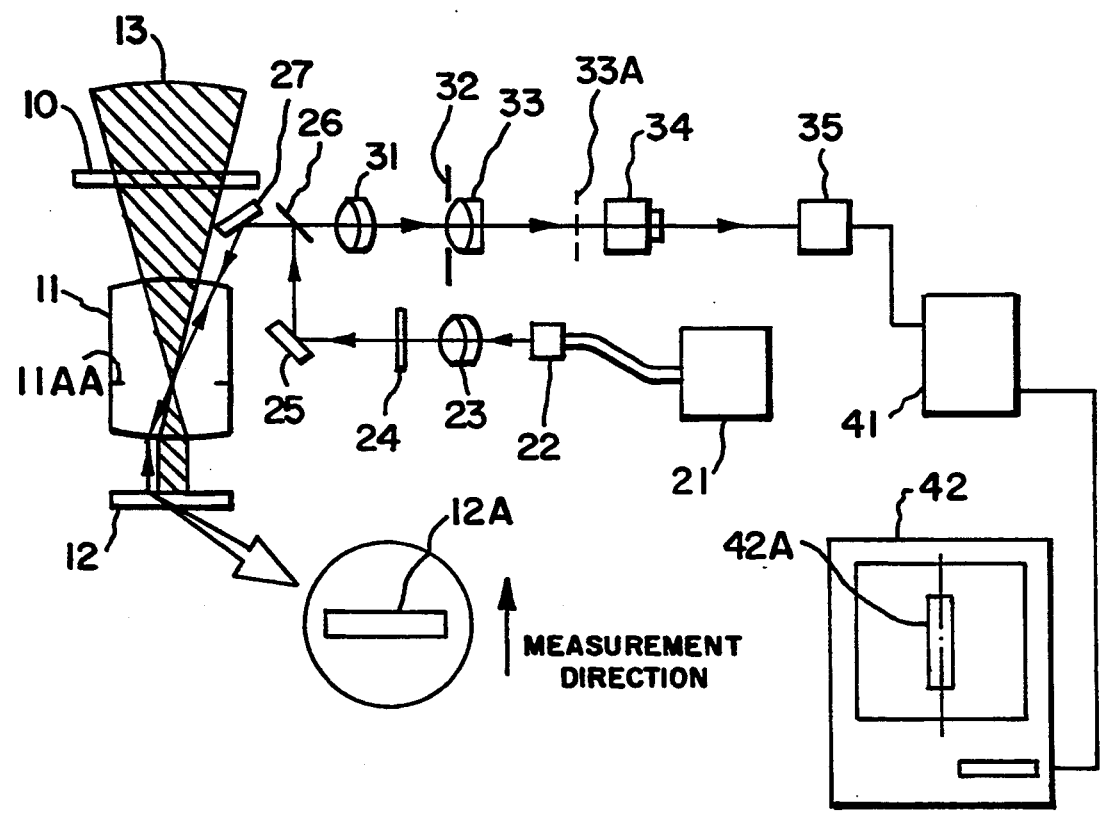
FIG. 11 shows a currently preferred embodiment of the broad-band illumination through-the-lens (TTL) alignment system for a stepper machine in accordance with the present invention.

FIG. 11 shows the currently preferred embodiment of the alignment system for a stepper machine, in accordance with-the present invention. The exposure system comprises the mask 10, the projection lens 11 and the wafer or substrate 12. Circuit patterns on the mask 10 are printed onto the wafer 12 through the projection lens 11 with the single-wavelength exposure light 13. The alignment system comprises all the illustrated parts except for the mask 10. The alignment system, shown in FIG. 11, measures the alignment mark location in the perpendicular direction to the plane of the paper (i.e., in the latitudinal or lateral direction). An alignment system to measure in the parallel direction (i.e., the longitudinal direction) to the plane of the paper is omitted in FIG. 11 for purposes of clarity. The illumination light for alignment is emitted from a halogen light source 21, and the light is guided by the optical fiber 22. The achromat lens 23 conjugates the end of the optical fiber 22 and the entrance pupil 11AA of the projection lens 11. The light emitted from the optical fiber 22 passes through achromat lens 23. The designed wavelength region, i.e., from 550 nm to 650 nm is selected by optical bandpass filter 24. The light passing the bandpass filter 24 is bent by the bending mirror 25 and impinges onto pelicle beam splitter 26. The light bent by the pelicle beam splitter 26 is bent again by the bending mirror 27 and, passing the center of the entrance pupil 11AA of projection lens assembly 11, illuminates the alignment mark 12A on wafer 12. The reflected light from the alignment mark 12A goes back through the projection lens 11, the bending mirror 27 and the pelicle beam splitter 26, and converges at the achromat lens 31. The first image of the alignment mark 12A is obtained in the achromat lens 31. The light passing achromat lens 31 diverges into the aperture stop 32 and the refractive/diffractive hybrid lens 33, and converges again at the secondary imaging plane 33A.

The secondary image of the alignment mark 12A is magnified and imaged by objective lens 34 onto TV camera 35. The final magnified image taken by TV camera 35 is transferred to a A/D converter 41, and the image 42A is processed by the computer 42 to measure the location of the alignment mark 12A on wafer or substrate 12.

From the foregoing detailed description of the preferred embodiments of the invention, it will be apparent that there has been provided a chromatic aberration-corrected broad-band through-the-lens (TTL) optical imaging system for imaging alignment marks deposed on a substrate or wafer located in the exposure imaging position of a projection lens of an optical stepper machine. Variations and modifications of the herein described optical system within the scope of the invention, will undoubtedly suggest themselves to those skilled in the art. Accordingly, the foregoing description is to be taken as illustrative and not in a limiting sense.

We claim:

1. A chromatic aberration-corrected optical system for broad-band through-the-lens imaging and position detection of alignment marks disposed on a substrate located at the exposure plane of an exposure apparatus, comprising:
    (a) a first projection lens for focusing a first broad-band alignment illumination and a second exposure illumination onto said substrate located at said exposure plane of said exposure apparatus;
    (b) imaging optics responsive to said broad-band alignment illumination from said alignment marks comprising:
        (i) a second achromat lens in the path of light from said alignment marks when illuminated by said first broad-band alignment illumination;
        (ii) a third refractive/diffractive hybrid lens in the path of light from said second lens for correcting longitudinal and lateral chromatic aberrations induced in said first projection lens by said first broad-band alignment illumination; and
        (iii) an aperture stop positioned between said second and third lenses and adjacent to the surface of the refractive element of said third refractive/diffractive hybrid lens;
    (c) means for providing said first broad-band alignment illumination and said second exposure illumination to said first projection lens; and
    (d) means for detecting the position of said alignment marks from said imaging of said alignment marks by said first broad-band alignment illumination.

2. The chromatic aberration-corrected optical system according to claim 1, wherein:
    said second achromat lens is located at the image point of said first projection lens;
    said second achromat lens images said first projection lens onto said third refractive/diffractive hybrid lens; and
    said third refractive/diffractive hybrid lens relays the image formed by said first projection lens.

3. The chromatic aberration-corrected optical system according to claim 1, wherein:
    said chromatic aberration correction is achieved in accordance with the following relationship:

$$\phi_3(\lambda) = -\frac{B^2}{C^2}\{\phi_1(\lambda) - \phi_1(\lambda_0)\} + \phi_3(\lambda_0),$$

where:
    $\lambda$ is a wavelength within the wavelength range of said first broad-band alignment illumination;
    $\lambda_0$ is a center wavelength within the wavelength range of said first broad-band alignment illumination;
    $\phi_1$ is the optical power of said first projection lens;
    $\phi_3$ is the optical power of said third refractive/diffractive hybrid lens;
    B is the distance between said first projection lens and said second achromat lens; and
    C is the distance between said second achromat lens and said third refractive/diffractive hybrid lens.

4. The chromatic aberration-corrected optical system according to claim 1, in which said third refractive/diffractive hybrid lens further comprises:
    a refractive doublet lens having a first part and a second part; and
    a diffractive lens.

5. The chromatic aberration-corrected optical system according to claim 4, wherein said third refractive/diffractive hybrid lens has a total optical power in accordance with the following relationship:

$$\phi_3(\lambda) = \phi_{rA}(\lambda) + \phi_{rB}(\lambda) + \phi_d(\lambda),$$

where:
    $\phi_{rA}$ is the optical power of the first part of the refractive doublet lens of the refractive/diffractive hybrid lens;
    $\phi_{rB}$ is the optical power of the second part of the refractive doublet lens of the refractive/diffractive hybrid lens;
    $\phi_d$ is the optical power of the diffractive lens of the refractive/diffractive hybrid lens; and
    $\lambda$ is a wavelength within the wavelength range of the said first broad-band alignment illumination.

6. The chromatic aberration-corrected optical system according to claim 5, in which the spectral dispersion of the optical power of the said third refractive/diffractive hybrid lens is determined in accordance with the following relationships:

$$\Delta\phi_3 = -\left(\frac{\phi_{rA}(\lambda_0)}{V_{rA}} + \frac{\phi_{rB}(\lambda_0)}{V_{rB}}\right) + \phi_d(\lambda_0)\frac{\Delta\lambda}{\lambda_0},$$

where:

$$V_{rA} = \frac{n_{rA}(\lambda_0) - 1}{n_{rA}(\lambda_2) - n_{rA}(\lambda_1)}$$

is the Abbe-V number indicative of the spectral dispersion of the first part of the refractive doublet lens;
and $$V_{rB} = \frac{n_{rB}(\lambda_0) - 1}{n_{rB}(\lambda_2) - n_{rB}(\lambda_1)}$$

is the Abbe-V number indicative of the spectral dispersion of the second part of the refractive doublet lens;
and:

$\Delta\phi_3$ is the spectral dispersion of the total optical power of the said third refractive/diffractive hybrid lens over a wavelength range $\Delta\lambda$.

$\Delta\lambda$ is set to a value of 100 nm for the total wavelength range of the said first broad-band alignment illumination;

$n_{rA}$; $n_{rB}$ are the refractive indices of the first and second parts, respectively, of the refractive doublet lens at respective wavelengths $\lambda_0 = 600$ nm; $\lambda_1 = 550$ nm and $\lambda_2 = 650$ nm, with $\Delta\lambda = (\lambda_2 - \lambda_1)$.

7. The chromatic aberration-corrected optical system according to claim 6, in which the condition for achieving chromatic aberration correction of the first and second parts, respectively, of the refractive doublet lens of the said third refractive/diffractive hybrid lens is determined in accordance with the following relationship:

$$\frac{\phi_{rA}(\lambda_0)}{V_{rA}} + \frac{\phi_{rB}(\lambda_0)}{V_{rB}} = 0.$$

8. The chromatic aberration-corrected optical system according to claim 5, wherein the required optical power of the diffractive lens of the said third refractive/diffractive hybrid lens is determined in accordance with the following relationship:

$$\phi_d(\lambda_0) = \frac{\lambda_0}{\Delta\lambda} \Delta\phi_3,$$

where:
$\phi_d(\lambda_0)$ is the optical power of the diffractive lens at the center wavelength $\lambda_0 = 600$ nm;
$\Delta\lambda$ is the wavelength range, set to a value of 100 nm, of the said first broad-band alignment illumination; and
$\Delta\phi_3$ is the change in optical power of the said third refractive/diffractive hybrid lens over the wavelength range $\Delta\lambda$.

9. The chromatic aberration-corrected optical system according to claim 5, wherein the required total optical power of the refractive doublet lens of the said third refractive/diffractive hybrid lens is determined in accordance with the following relationship:

$$\phi_{rA}(\lambda_0) + \phi_{rB}(\lambda_0) = \phi_3(\lambda_0) - \phi_d(\lambda_0),$$

where:
$\phi_{rA}(\lambda_0)$ is the optical power of the said first part of the refractive doublet lens at a center wavelength $\lambda_0 = 600$ nm;
$\phi_{rB}(\lambda_0)$ is the optical power of said second part of the refractive doublet lens at a center wavelength $\lambda_0 = 600$ nm;
$\phi_3(\lambda_0)$ is the total optical power of the said third refractive/diffractive hybrid lens at a center wavelength $\lambda_0 = 600$ nm; and
$\phi_d(\lambda_0)$ is the optical power of the diffractive lens at a center wavelength $\lambda_0 = 600$ nm.

10. The chromatic aberration-corrected optical system according to claim 9, wherein the required optical powers for the first and second parts, respectively, of the refractive doublet lens of the said third refractive/diffractive hybrid lens are established in accordance with the following relationships:

$$\phi_{rA} = \frac{V_{rA}}{V_{rA} - V_{rB}} \{\phi_3(\lambda_0) - \phi_d(\lambda_0)\},$$

and $$\phi_{rB} = \frac{V_{rB}}{V_{rB} - V_{rA}} \{\phi_3(\lambda_0) - \phi_d(\lambda_0)\},$$

where:
$\phi_{rA}$ is the optical power of the first part of the refractive doublet lens;
$\phi_{rB}$ is the optical power of the second part of the refractive doublet lens;
$\phi_3(\lambda_0)$ is the total optical power of the said third refractive/diffractive hybrid lens at a center wavelength $\lambda_0 = 600$ nm;
$\phi_d(\lambda_0)$ is the optical power of the diffractive lens at a center wavelength $\lambda_0 = 600$ nm; and
$V_{rA}$, $V_{rB}$ are the Abbe-V numbers indicative of the spectral dispersion of the optical power of the first and second parts, respectively, of the refractive doublet lens.

11. The chromatic aberration-corrected optical system according to claim 10, in which the optical powers for the first and second parts, respectively, of the refractive doublet lens of the said third refractive/diffractive hybrid lens are determined in terms of lens surface curvatures in accordance with the following relationships:

$$\phi_{rA}(\lambda_0) = (n_{rA}(\lambda_0) - 1)(c_2 - c_1),$$

and $$\phi_{rB}(\lambda_0) = (n_{rB}(\lambda_0) - 1)(c_3 - c_2),$$

where:
$c_1$; $c_2$ are the curvatures of the front and rear surface, respectively, of the first part of the refractive doublet lens;
$c_3$ is the curvature of the rear surface of the second part of the refractive doublet lens; and
$n_{rA}(\lambda_0)$; are the refractive indices of the first and second part,
$n_{rB}(\lambda_0)$; respectively, of the refractive doublet lens, at a center wavelength $\lambda_0 = 600$ nm.

* * * * *